United States Patent
Chen

(10) Patent No.: US 7,990,278 B2
(45) Date of Patent: Aug. 2, 2011

(54) SYSTEM AND METHOD FOR DETECTING POWER SUPPLY ERROR OF ELECTRONIC DEVICE AND ELECTRONIC DEVICE

(75) Inventor: Chao-Jen Chen, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 359 days.

(21) Appl. No.: 12/241,059

(22) Filed: Sep. 30, 2008

(65) Prior Publication Data

US 2009/0309746 A1 Dec. 17, 2009

(30) Foreign Application Priority Data

Jun. 13, 2008 (CN) .......................... 2008 1 0302129

(51) Int. Cl.
*G08B 21/00* (2006.01)
(52) U.S. Cl. ........................................ 340/654; 340/652
(58) Field of Classification Search .................. 340/654, 340/644, 652, 660, 663; 307/66
See application file for complete search history.

(56) References Cited

U.S. PATENT DOCUMENTS

| 3,641,545 | A | * | 2/1972 | Okada | 340/654 |
| 4,618,857 | A | * | 10/1986 | Dubois et al. | 340/654 |
| 5,376,920 | A | * | 12/1994 | Baily | 340/654 |
| 6,788,214 | B2 | * | 9/2004 | Lelecas | 340/654 |
| 7,009,514 | B2 | * | 3/2006 | Dupeire | 340/654 |

* cited by examiner

*Primary Examiner* — John A Tweel, Jr.
(74) *Attorney, Agent, or Firm* — Frank R. Niranjan

(57) ABSTRACT

An electronic device powered by a primary power source includes a switch, a first detection unit, a second detection unit, a warning unit and a secondary power source. The switch is configured for connecting and disconnecting the primary power source and the electronic device. The first detection unit is configured for detecting whether the switch is activated. The second detection unit is configured for detecting whether the primary power source is available if the switch is activated. The warning unit is configured for activating an alarm if the primary power source is unavailable. The secondary power source is configured for supplying electrical power to the first detection unit, the second detection unit and the warning unit.

6 Claims, 3 Drawing Sheets

SYSTEM AND METHOD FOR DETECTING POWER SUPPLY ERROR OF ELECTRONIC DEVICE AND ELECTRONIC DEVICE

BACKGROUND

1. Technical Field

The disclosure relates to electronic devices, and particularly, to a system and a method for detecting power supply error of an electronic device and an electronic device.

2. Description of the Related Art

Electronic devices are widely used in our daily activities. Generally, these electronic devices include power source switches which, when activated, turn on these electronic devices.

Certain factors may cause power supply error with the electronic devices. For example, the electrical connection between the power source and the electronic device has not been established properly. As a result, activating the power source switch does not turn on the electronic device, thereby causing users to question the quality of the electronic device and possibly request diagnosis of the problem with the electronic device. This inevitably brings inconvenience to both the user/buyer and the seller of the electronic device.

What is needed, therefore, is to provide a system and a method for detecting power supply error of an electronic device and an electronic device, which can overcome the abovementioned problem.

DETAILED DESCRIPTION OF THE EMBODIMENTS

Figure 1:
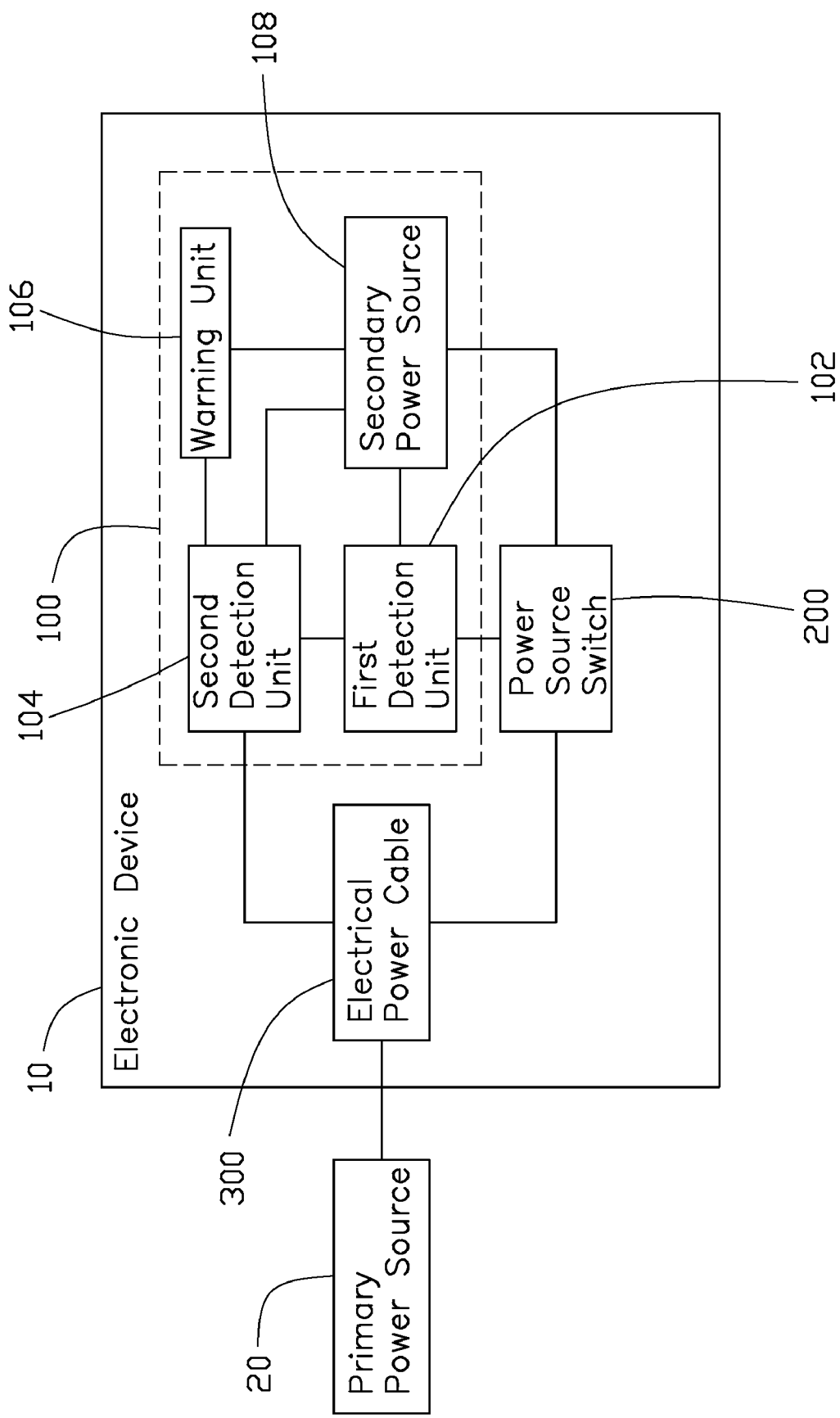
FIG. 1 is a functional block diagram of an electronic device according to an exemplary embodiment.
Figure 2:
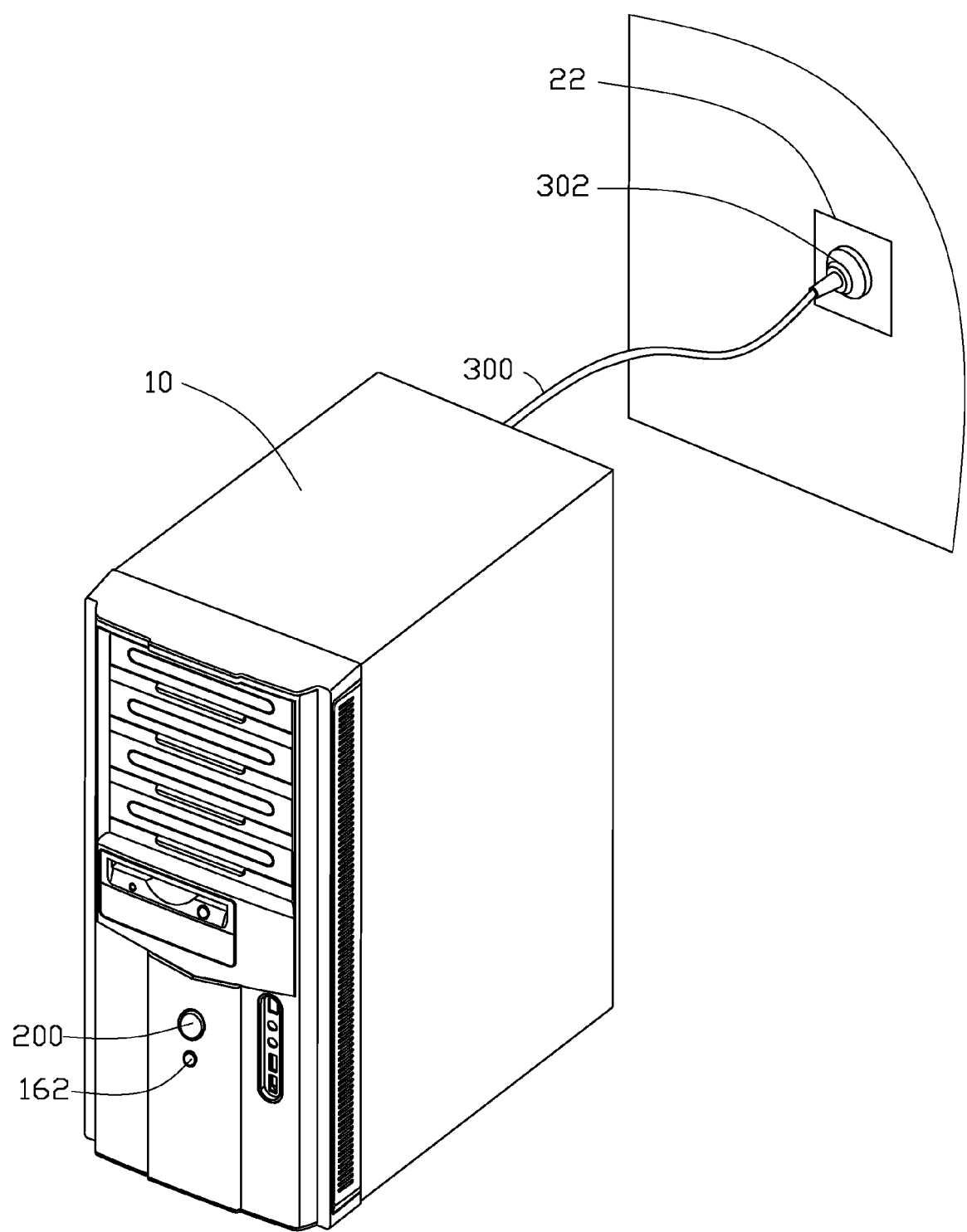
FIG. 2 is a schematic view of the electronic device of FIG. 1, showing a plug coupled to a socket.
Figure 3:
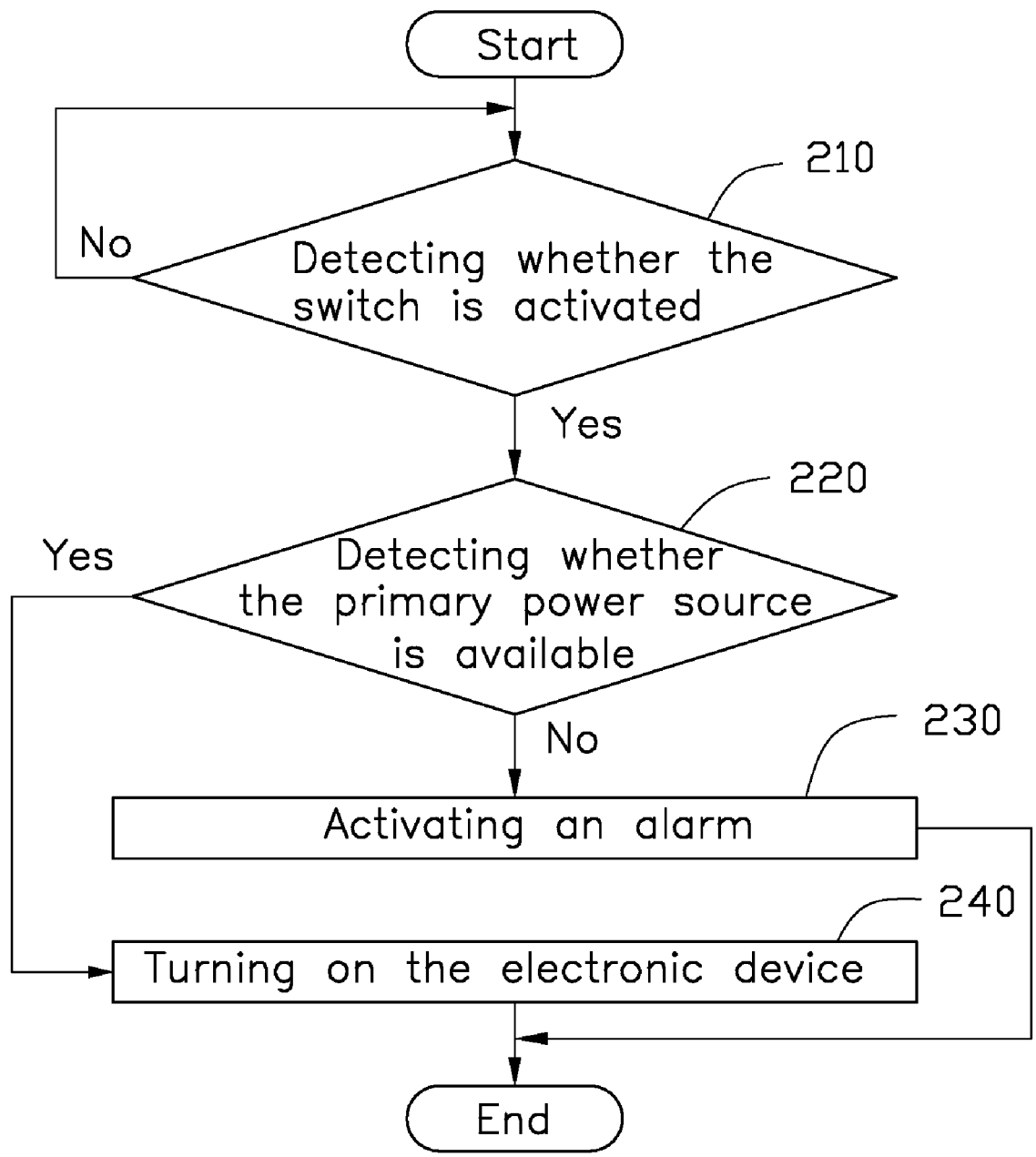
FIG. 3 is a flowchart of a method for detecting power supply error of the electronic device of FIG. 1.

Referring to FIGS. 1 to 3, an electronic device 10 using a system 100 for detecting power supply error is shown. In this embodiment, the electronic device 10 may be a personal computer and includes the system 100 for detecting power supply error, a switch 200 and an electrical power cable 300. A primary power source 20 is used for supplying electrical power to the electronic device 10 and may include a socket 22. The primary power source 20 may be an alternating-current power source with a voltage value of 220 or 110. The electrical power cable 300 is used for receiving primary electrical power from the primary power source 20 and may include a plug 302 configured for coupling to the socket 22 of the primary power source 20. The switch 200 is configured for connecting and disconnecting the primary power source 20 and the electronic device 10.

The system 100 includes a first detection unit 102, a second detection unit 104, a warning unit 106, and a secondary power source 108.

The first detection unit 102 is configured for detecting whether the switch 200 is activated. The first detection unit 102 may generate a first trigger signal when detecting the switch 200 is activated.

The second detection unit 104 is configured for detecting whether the primary power source is available if the switch 200 is activated. The second detection unit 104 may detect whether the primary power source 20 is available according to the first trigger signal and generate a second trigger signal if the primary power source is unavailable. The second detection unit 104 may include a voltage sensor for measuring a voltage applied to the electronic device 10 via the plug 302 and the electrical power cable 300. If the measured voltage is approximately the same as a voltage of the primary power source 20, this means the second detection unit detected that the primary electrical power is available. In other embodiments, the second detection unit 104 may include a current sensor for measuring a current through the plug 302 of the electrical power cable 300.

The warning unit 106 is configured for activating an alarm if the primary power source is unavailable. In this embodiment, the warning unit 106 may activate the alarm according to the second trigger signal and include a speaker (not shown) and/or a light emitting diode 162. Correspondingly, the alarm may be in an audible form, such as beeps emitted from the speaker, and/or a visual warning, such as flashes emitted by the light emitting diode 162. When the switch 200 is activated, and the light emitting diode 162 is on, it means that the electronic device 10 is not receiving power due to no power or a faulty plug 302 or a faulty connection between the plug 302 and the socket 22.

The secondary power source 108 is configured for supplying electrical power to the first detection unit 102, the second detection unit 104 and the warning unit 106. The secondary power source 108 may be a rechargeable power source and may be charged by the primary power source 20 when the electronic device 10 has been turned on. The secondary power source 108 may store an amount of charge to ensure a normal working order of the power source monitoring system 100.

Referring to FIG. 3, a method for detecting power supply error of the electronic device 10 includes step 210 through step 240. Step 210: detecting whether the switch 200 is activated. Step 220: detecting whether the primary power source is available when the switch is activated. Step 230: activating an alarm if the primary power source is unavailable. Step 240: turning on the electronic device if the primary electrical power is available.

In summary, the power source monitoring system 100 and the method can warn the user when the electrical primary power is unavailable. Therefore, an examination of the electrical connection and the primary power source may be performed.

Finally, it is to be understood that the above-described embodiments are intended to illustrate rather than limit the invention. Variations may be made to the embodiments without departing from the spirit of the invention as claimed.

What is claimed is:

1. A system for detecting power supply error of an electronic device, the electronic device being powered by a primary power source and comprising a switch for connecting and disconnecting the primary power source and the electronic device, the system comprising:
    a first detection unit configured for detecting whether the switch is activated and generating a first trigger signal if the switch is activated;
    a second detection unit configured for detecting whether the primary power source is available according to the first trigger signal and generating a second trigger signal if the primary power source is unavailable;
    a warning unit configured for activating an alarm according to the second trigger signal; and
    a secondary power source configured for supplying electrical power to the first detection unit, the second detection unit and the warning unit.

2. The system as claimed in claim 1, wherein the secondary power source is a rechargeable power source.

3. The system as claimed in claim 1, wherein the warning unit comprises a speaker.

4. The system as claimed in claim 1, wherein the warning unit comprises a light emitting diode.

5. An electronic device powered by a primary power source, the electronic device comprising:
- a switch configured for connecting and disconnecting the primary power source and the electronic device;
- a first detection unit configured for detecting whether the switch is activated and generating a first trigger signal if the switch is activated;
- a second detection unit configured for detecting whether the primary power source is available according to the first trigger signal and generating a second trigger signal if the primary power source is unavailable;
- a warning unit configured for activating an alarm according to the second trigger signal; and
- a secondary power source configured for supplying electrical power to the first detection unit, the second detection unit and the warning unit.

6. A method for detecting power supply error of an electronic device using the system for detecting power supply error of the electronic device of claim 1, the electronic device being powered by a primary power source and comprising a switch for connecting and disconnecting the primary power source and the electronic device, the method comprising:
- detecting whether the switch is activated, using the first detection unit;
- generating a first trigger signal if the switch is activated, using the first detection unit;
- detecting whether the primary power source is available according to the first trigger signal, using the second detection unit;
- generating a second trigger signal if the primary power source is unavailable, using the second detection unit; and
- activating an alarm according to the second trigger signal, using the warning unit.

\* \* \* \* \*